United States Patent
Lee et al.

(10) Patent No.: US 10,211,273 B2
(45) Date of Patent: Feb. 19, 2019

(54) DISPLAY APPARATUS

(71) Applicant: SAMSUNG DISPLAY CO., LTD., Yongin, Gyeonggi-Do (KR)

(72) Inventors: Kwanghoon Lee, Yongin (KR); Mugyeom Kim, Yongin (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 162 days.

(21) Appl. No.: 14/656,905

(22) Filed: Mar. 13, 2015

(65) Prior Publication Data
US 2016/0104756 A1  Apr. 14, 2016

(30) Foreign Application Priority Data
Oct. 8, 2014  (KR) .................. 10-2014-0135966

(51) Int. Cl.
*H01L 27/32* (2006.01)
*H01L 51/00* (2006.01)

(52) U.S. Cl.
CPC ........ *H01L 27/3276* (2013.01); *H01L 27/326* (2013.01); *H01L 27/3218* (2013.01); *H01L 51/0097* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 9,730,330 B1* | 8/2017 | Boyle | H05K 1/189 |
| 2007/0122590 A1* | 5/2007 | Lalvani | B32B 3/266 |
| | | | 428/136 |
| 2008/0055831 A1 | 3/2008 | Satoh | |
| 2008/0218369 A1* | 9/2008 | Krans | A47G 9/1045 |
| | | | 340/691.1 |
| 2010/0309233 A1 | 12/2010 | Choi | |
| 2010/0330338 A1* | 12/2010 | Boyce | B29C 59/02 |
| | | | 428/156 |
| 2011/0039097 A1* | 2/2011 | Murashige | B32B 17/064 |
| | | | 428/337 |

FOREIGN PATENT DOCUMENTS

| KR | 10-2008-0076554 A | 8/2008 |
|---|---|---|
| KR | 10-2012-0059946 A | 6/2012 |
| KR | 10-2014-0048025 A | 4/2014 |

* cited by examiner

*Primary Examiner* — Tom Thomas
*Assistant Examiner* — Steven B Gauthier
(74) *Attorney, Agent, or Firm* — Lee & Morse P.C.

(57) ABSTRACT

Provided is a display apparatus, including a substrate; a plurality of pixels that are on the substrate and include at least one display device; a separation area that is on the substrate and between two adjacent pixels from among the plurality of pixels; and a penetrating portion that is in the separation area and penetrates the substrate.

20 Claims, 12 Drawing Sheets

DISPLAY APPARATUS

CROSS-REFERENCE TO RELATED APPLICATION

Korean Patent Application No. 10-2014-0135966, filed on Oct. 8, 2014, in the Korean Intellectual Property Office, and entitled: "Display Apparatus," is incorporated by reference herein in its entirety.

BACKGROUND

1. Field

One or more exemplary embodiments relate to a display apparatus.

2. Description of the Related Art

Uses of display apparatuses have become more diversified. A range of uses of display apparatuses may expand as display apparatuses become thinner and more light-weight.

SUMMARY

Embodiments may be realized by providing a display apparatus, including a substrate; a plurality of pixels that are on the substrate and include at least one display device; a separation area that is on the substrate and between two adjacent pixels from among the plurality of pixels; and a penetrating portion that is in the separation area and penetrates the substrate.

The display apparatus may further include at least one wire electrically connected to the plurality of pixels. The at least one wire may not overlap the penetrating portion.

The at least one wire may extend in one direction and may include an area that protrudes and bends in a direction intersecting the one direction around the penetrating portion.

The at least one wire may include a plurality of wires, and two wires adjacent to each other in one direction from among the plurality of wires may be symmetrical about the penetrating portion.

The at least one wire may include a plurality of wires and the penetrating portion may include a plurality of penetrating portions; the plurality of wires may include a first wire, a second wire, and a third wire; the first wire may be electrically connected to pixels that are arranged in a first direction from among the plurality of pixels; the second and third wires may be each electrically connected to pixels arranged in a second direction crossing the first direction from among the plurality of pixels; the second wire may include an area that protrudes and bends in the first direction around one of the plurality of penetrating portions; and the third wire may include an area that protrudes and bends in the first direction around another one of the plurality of penetrating portions.

The separation area may include a first separation area and a second separation area, the first separation area may include an area between two pixels adjacent in a first direction from among the plurality of pixels, the second separation area may include an area between two pixels adjacent in a second direction intersecting the first direction from among the plurality of pixels, the penetrating portion may include a first penetrating portion and a second penetrating portion, and the first penetrating portion may be in the first separation area and the second penetrating portion may be in the second separation area.

The first penetrating portion may pass by the first separation area and may have an elongated shape corresponding to an area where an area obtained by extending the first separation area and an area obtained by extending the second separation area overlap each other.

The first penetrating portion may have an elongated shape corresponding to a space between the two pixels adjacent in the first direction and a space between the two pixels adjacent in the second direction.

The second penetrating portion may pass by the second separation area and may have an elongated shape corresponding to an area where an area obtained by extending the second separation area and an area obtained by extending the first separation area overlap each other.

The second penetrating portion may have an elongated shape corresponding to a space between the two pixels adjacent in the second direction and a space between the two pixels adjacent in the first direction.

The first penetrating portion and the second penetrating portion may be spaced apart from each other.

The penetrating portion may include a plurality of first penetrating portions and a plurality of second penetrating portions, at least one of the plurality of second penetrating portions may be between two adjacent first penetrating portions from among the plurality of first penetrating portions, and at least one of the plurality of first penetrating portions may be between two adjacent second penetrating portions from among the plurality of second penetrating portions.

The display apparatus may further include a first insulating layer on the substrate. The first insulating layer may overlap the penetrating portion.

The display apparatus may further include a first insulating layer on the substrate. The first insulating layer may include an insulating penetrating portion having an area overlapping the penetrating portion.

The plurality of pixels may each include a plurality of sub-pixels, sub-pixels of at least one pixel of the plurality of pixels may be arranged in one direction, and sub-pixels of a pixel adjacent to the at least one pixel may be arranged in a direction crossing the one direction.

The display apparatus may further include at least one wire electrically connected to each of the plurality of sub-pixels of each of the plurality of pixels. The at least one wire may not overlap the penetrating portion, and the at least one wire may include a plurality of connecting wires each connected to the plurality of sub-pixels of one of the plurality of pixels and spaced apart from each other, a common wire commonly connected to the plurality of connecting wires, and a body wire connected to the common wire and corresponding to a side of one of the plurality of sub-pixels.

The substrate may include a flexible material.

The flexible material may contain an organic material.

The display device may include a first electrode, a second electrode, and an intermediate layer between the first and second electrodes and including an organic emission layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
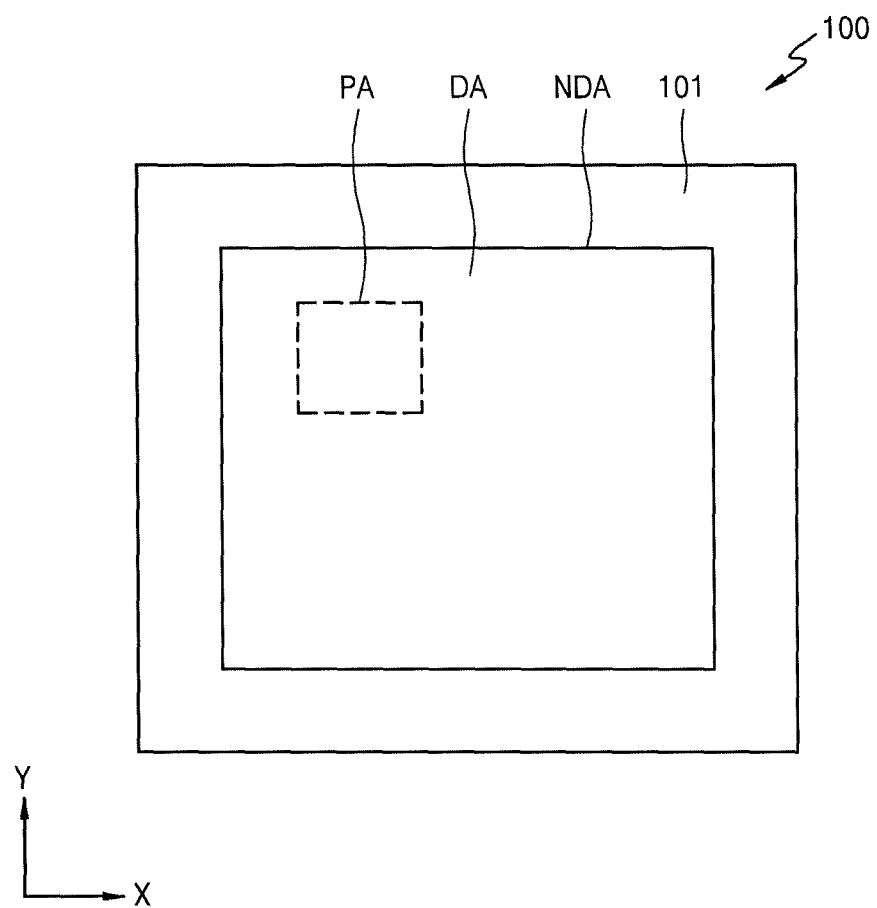
FIG. 1 illustrates a schematic plan view of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Hereinafter, one or more exemplary embodiments will be described below in more detail with reference to the accompanying drawings. Those components that are the same or are in correspondence are rendered the same reference numeral regardless of the figure number, and redundant explanations are omitted.

Figure 2:
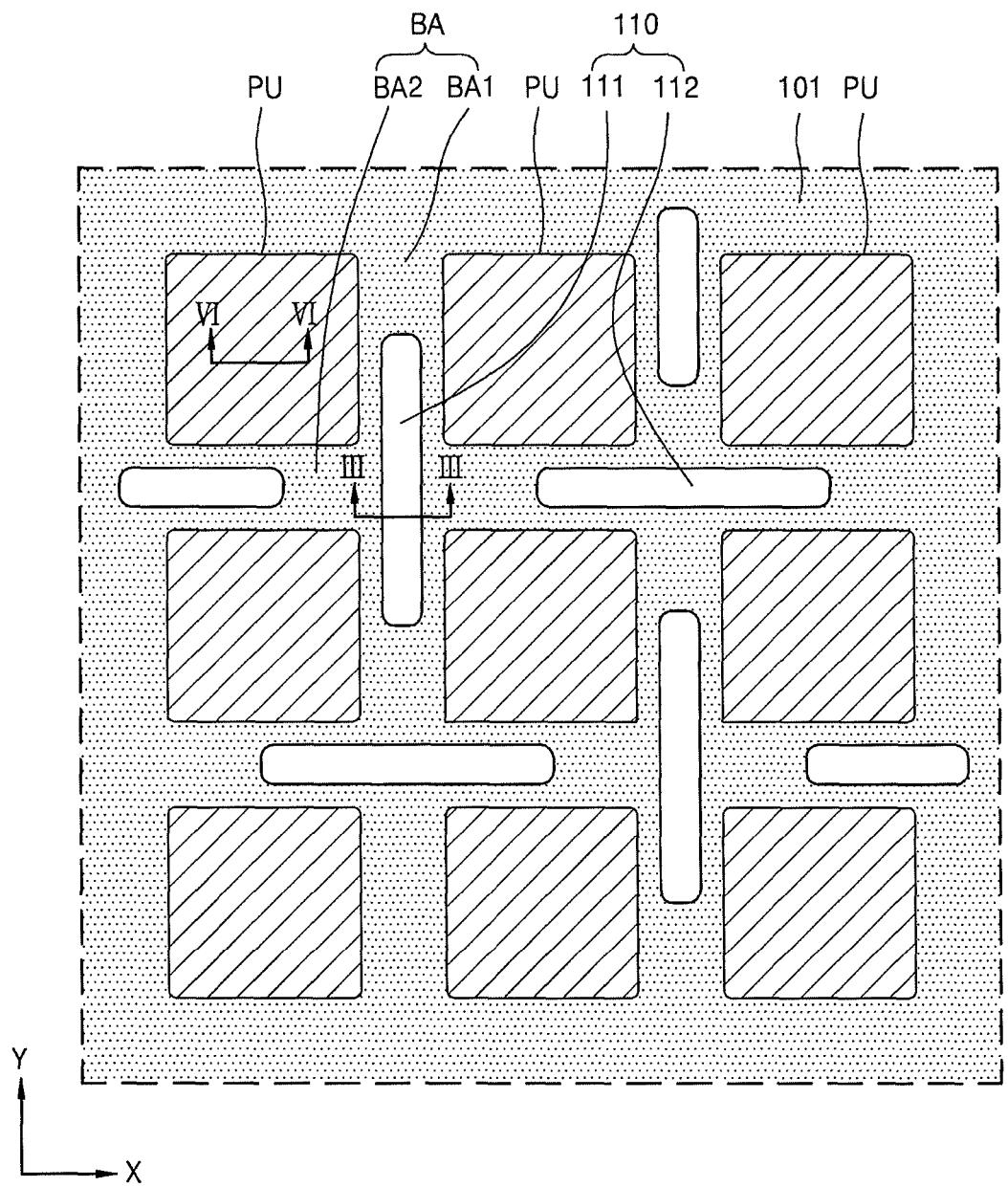
FIG. 2 illustrates an enlarged view of a region PA of the display apparatus of FIG. 1.

FIG. 1 illustrates a schematic plan view of a display apparatus 100 according to an exemplary embodiment, and FIG. 2 illustrates an enlarged view of a region PA of FIG. 1. Referring to FIGS. 1 and 2, the display apparatus 100 may include a substrate 101. A display area DA and a non-display area NDA may be defined on the substrate 101. At least one pixel PU and a penetrating portion 110 may be formed on the display area DA.

The substrate 101 may be formed of any one of various materials. For example, the substrate 101 may be formed of glass, metal, or an organic material.

According to an exemplary embodiment, the substrate 101 may be formed of a flexible material. For example, the substrate 101 may be formed of a material that is bendable, twistable, foldable, or rollable. The flexible material forming the substrate 101 may be ultra-thin glass, metal, or plastic. If the substrate 101 is formed of plastic, the substrate 101 may contain polyimide (PI). In an embodiment, the substrate 101 may contain another type of a plastic material.

The substrate 101 may be divided into the display area DA and the non-display area NDA. The at least one pixel PU may be formed in the display area DA such that an image may be displayed. The pixel PU may include a display device (not shown) so that visible light is realized.

The non-display area NDA may be formed adjacent to the display area DA. In FIG. 1, the non-display area NDA surrounds the display area DA.

According to an exemplary embodiment, the non-display area NDA may be formed adjacent to one side surface of the display area DA. According to another exemplary embodiment, the non-display area NDA may be formed adjacent to two or three side surfaces of the display area DA.

According to another exemplary embodiment, only the display area DA may exist on the substrate 101. Although not shown, the substrate 101 may only include the display area DA and not include the non-display area NDA.

The at least one pixel PU and the penetrating portion 110 may be formed in the display area DA.

A separation area BA may be formed between two adjacent pixels PU. The penetrating portion 110 may be formed in the separation area BA. According to an exemplary embodiment, the penetrating portion 110 may be spaced apart from the pixel PU.

The pixel PU may include at least one display device that may realize visible light, which will be described later with reference to FIGS. 6 and 7.

The penetrating portion 110 may be formed on the substrate 101. The penetrating portion 110 may be formed to penetrate through the substrate 101. For example, the penetrating portion 110 may be formed by removing a region of the substrate 101 via etching, or the substrate 101 may be manufactured to include the penetrating portion 110. A process of forming the penetrating portion 110 on the substrate 101 may vary.

The penetrating portion 110 may have an elongated shape in the separation area BA between the two adjacent pixels PU.

The penetrating portion 110 may include a first penetrating portion 111 and a second penetrating portion 112. The separation area BA may include a first separation area BA1 and a second separation area BA2. The first penetrating portion 111 may be formed in the first separation area BA1 and the second penetrating portion 112 may be formed in the second separation area BA2.

The penetrating portion 110 will now be described in detail.

First, the separation area BA may include the first and second separation areas BA1 and B2. The first separation area BA1 may be an area between the two pixels PU adjacent to each other in a first direction, for example, in an X-axis direction of FIG. 2. The second separation area BA2 may be an area between the two pixels PU adjacent to each other in a second direction crossing the first direction, for example, a Y-axis direction of FIG. 2

According to an exemplary embodiment, the first and second directions may cross each other at right angles.

The first penetrating portion 111 of the penetrating portion 110 may be formed in the first separation area BA1. The first penetrating portion 111 may have an elongated shape in a direction crossing the first direction, for example, in the second direction.

According to an exemplary embodiment, the first penetrating portion 111 may pass by the first separation area BA1, and, for example, may be formed to correspond to an area where an area obtained by extending the first separation area BA1 and an area obtained by extending the second separation area BA2 overlap each other.

According to an exemplary embodiment, the first penetrating portion 111 may have an elongated shape to correspond not only to the first separation area BA1 between the two pixels PU adjacent in the first direction, but also to the first separation area BA1 between the two pixels PU that are respectively adjacent, in the second direction, to the two pixels PU adjacent in the first direction.

The first penetrating portion 111 may correspond to one side surface of each of the two pixels PU adjacent in the first direction, and correspond to one side surface of each of the two pixels PU adjacent, in the second direction, to the two pixels PU adjacent in the first direction. For example, four pixels PU may be provided based on one first penetrating portion 111.

Referring to FIG. 2, the two pixels PU may be disposed on left and right sides of the first penetrating portion 111 at an upper region of the first penetrating portion 111, and the two pixels PU may be disposed on left and right sides of the first penetrating portion 111 at a lower region of the first penetrating portion 111.

The second penetrating portion 112 of the penetrating portion 110 may be formed in the second separation area BA2. The second penetrating portion 112 may have an elongated shape in a direction crossing the second direction, for example, in the first direction.

According to an exemplary embodiment, the second penetrating portion 112 may pass by the second separation area BA2, and for example, may be formed to correspond to an area where an area obtained by extending the second separation area BA2 and an area obtained by extending the first separation area BA1 overlap each other.

According to an exemplary embodiment, the second penetrating portion 112 may have an elongated shape to correspond not only to the second separation area BA2 between the two pixels PU adjacent in the second direction, but also to the second separation area BA2 between the two pixels PU that are respectively adjacent, in the first direction, to the two pixels PU adjacent in the second direction.

The second penetrating portion 112 may correspond to one side surface of each of the two pixels PU adjacent in the second direction, and correspond to one side surface of each of the two pixels PU adjacent, in the first direction, to the two pixels PU adjacent in the second direction. For example, four pixels PU may be provided based on one second penetrating portion 112.

Referring to FIG. 2, the two pixels PU may be disposed on top and bottom sides of the second penetrating portion 112 at a left region of the second penetrating portion 112, and the two pixels PU may be disposed on top and bottom sides of the second penetrating portion 112 at a right region of the first penetrating portion 111.

The first and second penetrating portions 111 and 112 may be spaced apart from each other.

In the display apparatus 100 according to an exemplary embodiment, the substrate 101 may include the penetrating portion 110, and the penetrating portion 110 may include a plurality of the first penetrating portions 111 and a plurality of the second penetrating portions 112.

According to an exemplary embodiment, the second penetrating portion 112 may be disposed between two adjacent first penetrating portions 111 from among the plurality of first penetrating portions 111. The first penetrating portion 111 may be disposed between two adjacent second penetrating portions 112 from among the plurality of second penetrating portions 112.

Figure 3:
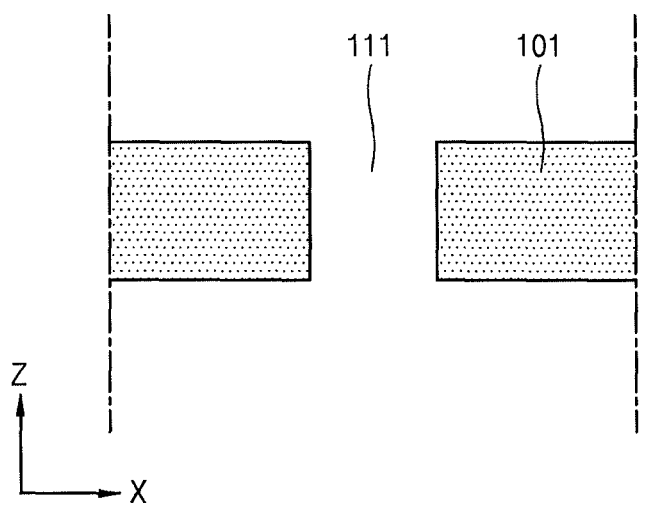
FIG. 3 illustrates a cross-sectional view taken along a line III-III of FIG. 2.

FIG. 3 illustrates a cross-sectional view taken along a line III-III of FIG. 2. Referring to FIG. 3, no component may be formed above and below the first penetrating portion 111, and flexibility of the substrate 101 may be increased.

In an embodiment, any one of various components may be formed to correspond to the first penetrating portion 111. In addition, although not illustrated, the same description may be applied to the second penetrating portion 112.

Figure 4:
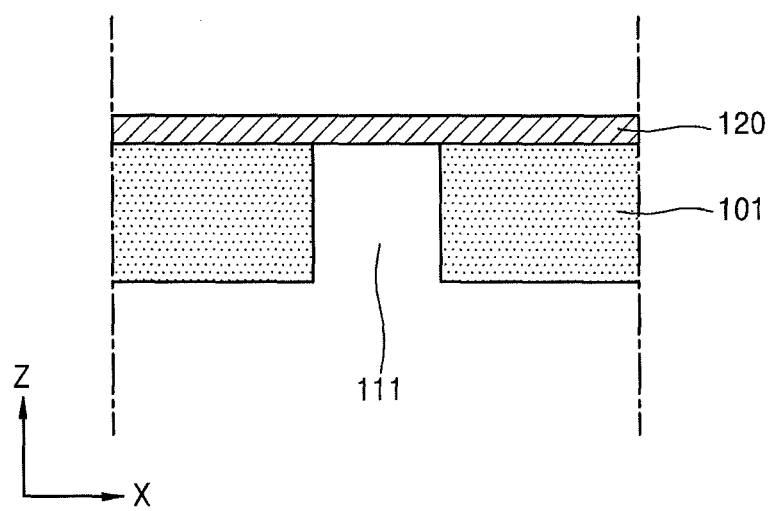
FIGS. 4 and 5 illustrate cross-sectional views of modified examples of FIG. 3.
Figure 5:
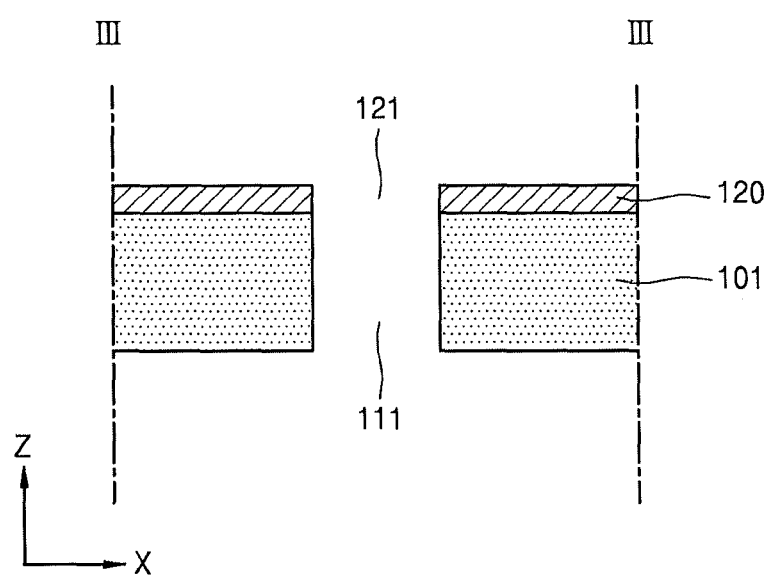

FIGS. 4 and 5 illustrate cross-sectional views of modified examples of FIG. 3. First, referring to FIG. 4, a first insulating layer 120 may formed on the substrate 101. The first insulating layer 120 may be formed to correspond to the first penetrating portion 111. The first insulating layer 120 may overlap at least a part of the first penetrating portion 111, or according to an exemplary embodiment, may entirely overlap the first penetrating portion 111.

In FIG. 4, the first insulating layer 120 includes one layer. In an embodiment, the first insulating layer 120 may include a plurality of layers.

According to an exemplary embodiment, the first insulating layer 120 may have a structure wherein at least one insulating layer included in the pixel PU extends.

Referring to FIG. 5, the first insulating layer 120 may be formed on the substrate 101, and may include an insulating penetrating portion 121 having an area overlapping at least the first penetrating portion 111.

The insulating penetrating portion 121 may be formed while forming the first insulating layer 120, and may overlap the first penetrating portion 111 such that the flexibility of the substrate 101 may be improved.

As described above, the pixel PU may include a display device (not shown) that will be described in detail with reference to FIGS. 6 and 7.

Figure 6:
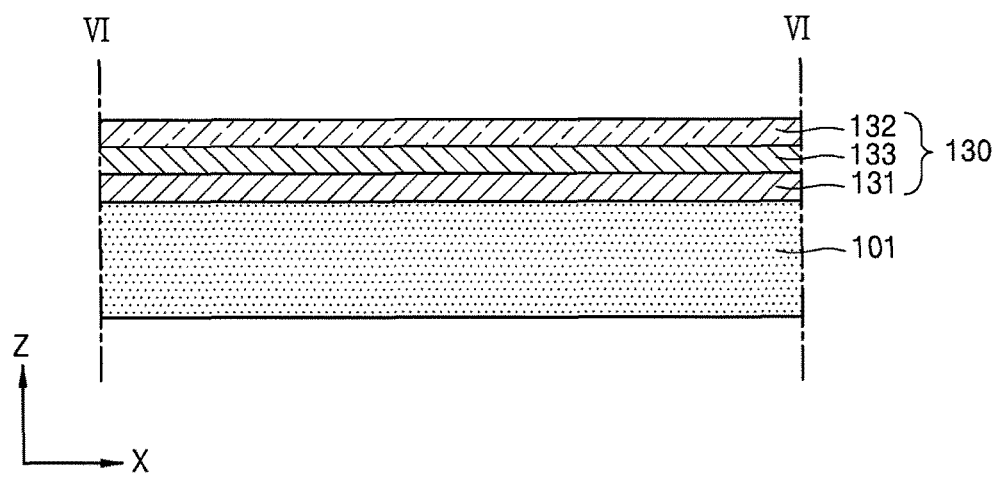
FIG. 6 illustrates a cross-sectional view taken along a line VI-VI of FIG. 2.

FIG. 6 illustrates a cross-sectional view taken along a line VI-VI of FIG. 2. Referring to FIG. 6, an organic lightemitting device (OLED) 130 may be formed on the substrate 101. In the current embodiment, the OLED 130 may be used as a display device.

Although not illustrated, according to an exemplary embodiment, any display device, such as a liquid crystal display device, may be applied not only to the display apparatus 100 according to the current embodiment, but also to any display apparatus according to one or more exemplary embodiments.

The OLED 130 may include a first electrode 131, a second electrode 132, and an intermediate layer 133.

The first electrode 131 may be formed on the substrate 101. Although not illustrated, a buffer layer (not shown) may be formed between the substrate 101 and the first electrode 131.

The first electrode 131 may be formed of any one of various conductive materials. According to an exemplary embodiment, the first electrode 131 may be formed of indium tin oxide (ITO), indium zinc oxide (IZO), zinc oxide (ZnO), or indium oxide ($In_2O_3$). According to another exemplary embodiment, the first electrode 131 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca).

The intermediate layer 133 may be formed on the first electrode 131. The intermediate layer 133 may include an organic emission layer that may realize visible light. The intermediate layer 133 may be formed of a low molecular or high molecular organic film. The intermediate layer 133 may include the organic emission layer and may further include at least one of a hole injection layer (HIL), a hole transport layer (HTL), an electron transport layer (ETL), and an electron injection layer (EIL).

The second electrode 132 may be formed on the intermediate layer 133. The second electrode 132 may be formed of any one of various conductive materials. According to an exemplary embodiment, the second electrode 132 may be formed of a metal, such as Ag, Mg, Al, Pt, Pd, Au, Ni, Nd, Ir, Cr, Li, or Ca.

Figure 7:
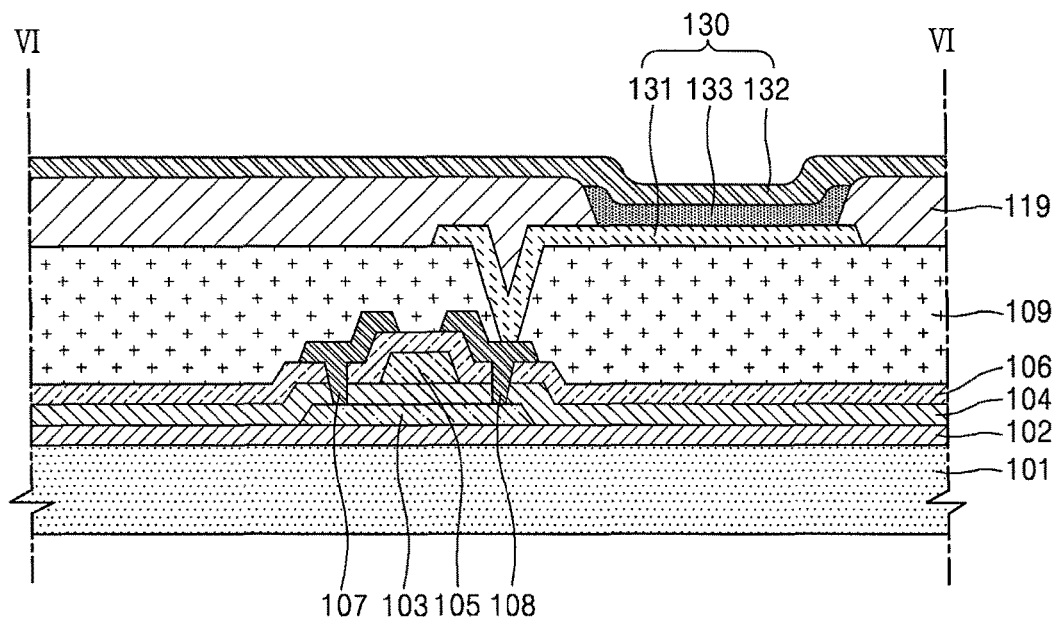
FIG. 7 illustrates a cross-sectional view of a modified example of FIG. 6.

FIG. 7 illustrates a cross-sectional view of a modified example of FIG. 6. Referring to FIG. 7, the OLED 130 and a thin-film transistor (TFT) may be formed on the substrate 101.

The OLED 130 may include the first electrode 131, the second electrode 132, and the intermediate layer 133.

The TFT may include an active layer 103, a gate electrode 105, a source electrode 107, and a drain electrode 108.

The active layer 103 may be formed on the substrate 101, and according to an exemplary embodiment, a buffer layer 102 may be formed between the substrate 101 and the active layer 103.

The active layer 103 may contain an inorganic semiconductor material, such as silicon, organic semiconductor material, or an oxide semiconductor material, and may be formed by selectively injecting a p-type or n-type dopant into the semiconductor material.

A gate insulating layer 104 may be formed on the active layer 103. The gate electrode 105 may be formed on the gate insulating layer 104 correspondingly to the active layer 103.

An interlayer insulating layer 106 may be formed to cover the gate electrode 105, and the source and drain electrodes 107 and 108 may be formed on the interlayer insulating layer 106 while contacting a certain region of the active layer 103.

A passivation layer 109 may be formed to cover the source and drain electrodes 107 and 108. According to an exemplary embodiment, a top surface of the passivation layer 109 may be a flat surface. According to another exemplary embodiment, a planarization film (not shown) may be further formed on the passivation layer 109.

The first electrode 131 may be formed on the passivation layer 109. The first electrode 131 may be electrically connected to any one of the source and drain electrodes 107 and 108. In FIG. 7, for convenience of description, the first electrode 131 is connected to the drain electrode 108.

A pixel-defining film 119 may be formed on the first electrode 131. The pixel-defining film 119 may be formed such as not to cover at least a certain region of a top surface of the first electrode 131. The intermediate layer 133 including the organic emission layer may be formed on such a certain region of the top surface of the first electrode 131. The second electrode 132 may be formed on the intermediate layer 133.

According to an exemplary embodiment, at least one of the buffer layer 102, the gate insulating layer 104, the interlayer insulating layer 106, the passivation layer 109, and the pixel-defining film 119 may be formed to overlap the penetrating portion 110, or in an embodiment, may have an insulating penetrating portion (not shown) corresponding to the penetrating portion 110.

In the display apparatus 100 according to the current embodiment, the penetrating portion 110 may be formed in the substrate 101, and the flexibility of the substrate 101 may be improved and the weight of the substrate 101 may be decreased.

The penetrating portion 110 may be formed in the separation area BA between the pixels PU from among areas of the substrate 101 such that the substrate 101 may be easily transformed, for example, bent, curved, or rolled, around the pixels PU, and stress generated during the transformation may be reduced or blocked. If the display apparatus 100 is applied as a bending display apparatus, a flexible display apparatus, or a stretchable display apparatus, the display apparatus 100 may have high flexibility and reduced abnormal transformation.

According to an exemplary embodiment, since the penetrating portion 110 may include the first penetrating portion 111 extending in one direction and the second penetrating portion 112 extending in a direction crossing the one direction, the flexibility of the substrate 101 may be obtained even when the substrate 101 is bent, curved, or rolled in any direction, abnormal transformation of the substrate 101 may be prevented, and durability of the substrate 101 may be improved. Accordingly, convenience of a user may be improved when the display apparatus 100 is used, and the display apparatus 100 may be applied to a wearable apparatus.

According to an exemplary embodiment, the first penetrating portion 111 of the penetrating portion 110 may be formed in an elongated shape to correspond to two pixels PU adjacent in one direction and other two pixels PU respectively adjacent to the two pixels PU, a transformation characteristic may be prevented from being changed at a boundary between the pixels PU to improve durability of the display apparatus 100, and the substrate 101 may be applied to a display apparatus 100 that may require flexibility, such as a bending display apparatus, a flexible display apparatus, or a stretchable display apparatus.

According to an exemplary embodiment, the second penetrating portion 112 of the penetrating portion 110 may be formed in a direction crossing a direction in which the first penetrating portion 111 is formed and in an elongated shape to correspond to two pixels PU and other two pixels PU respectively adjacent to the two pixels PU, a transformation characteristic may be prevented from being changed at a boundary between the pixels PU to improve the durability of the display apparatus 100, and the substrate 101 may be applied to a display apparatus 100 that may require flexibility, such as a bending display apparatus, a flexible display apparatus, or a stretchable display apparatus.

According to an exemplary embodiment, the second penetrating portion 112 may be disposed between two adjacent first penetrating portions 111 from among the plurality of first penetrating portions 111, and a crack may be prevented from being generated in a length direction of the first penetrating portion 111 of the substrate 101 by extending the first penetrating portion 111 in one direction.

The first penetrating portion 111 may be disposed between two adjacent second penetrating portions 112 from among the plurality of second penetrating portions 112, and a crack may be prevented from being generated in a length direction of the second penetrating portion 112 of the substrate 101 by extending the second penetrating portion 112 in one direction.

Figure 8:
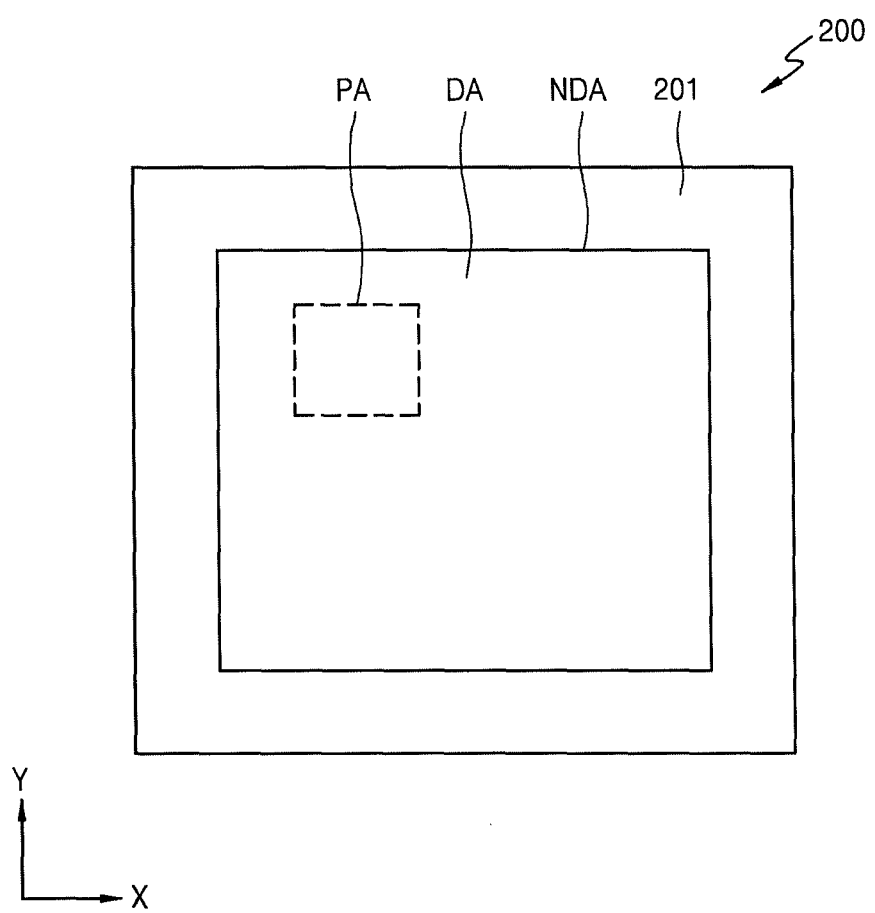
FIG. 8 illustrates a schematic plan view of a display apparatus according to another exemplary embodiment.
Figure 9:
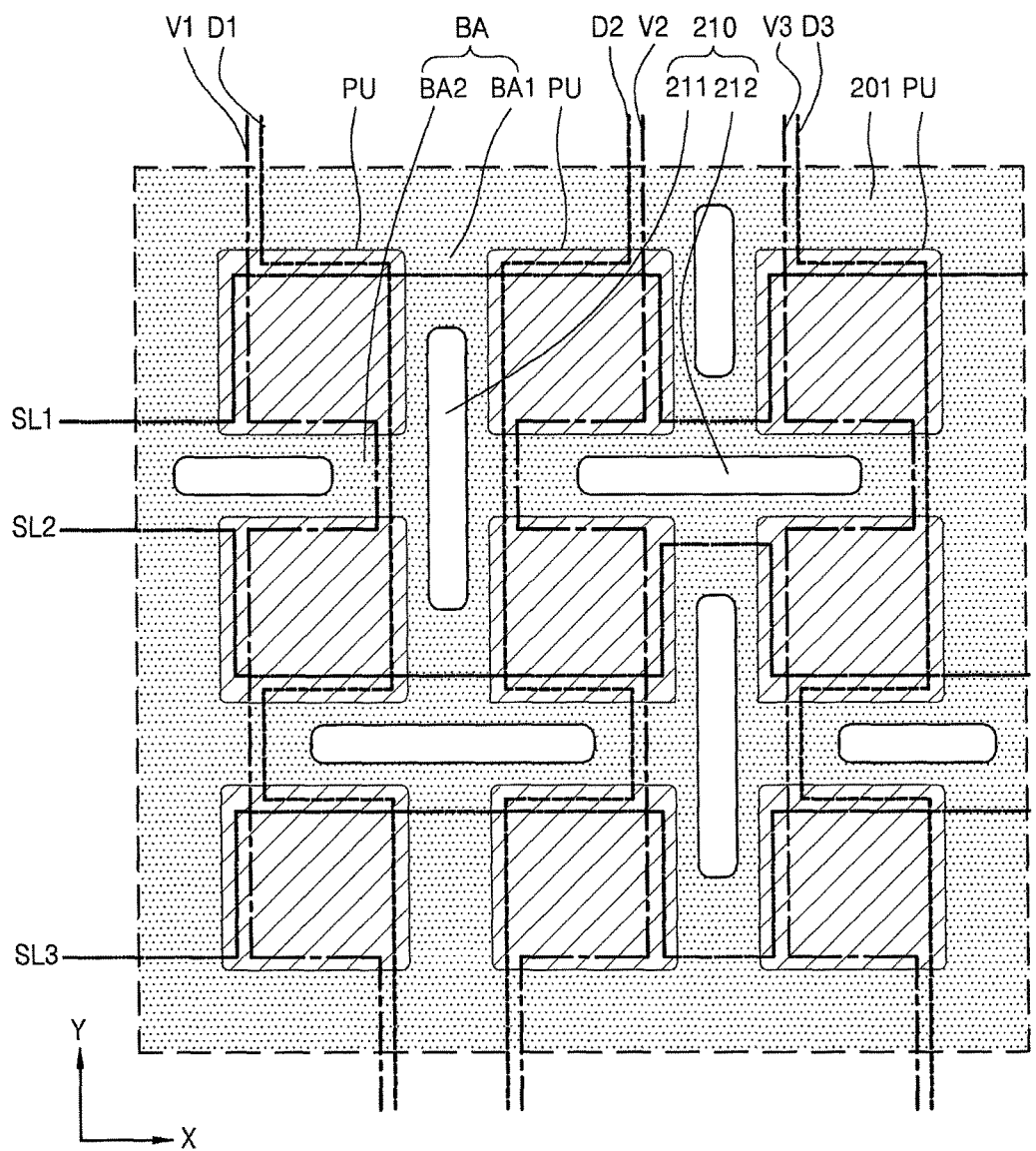
FIG. 9 illustrates an enlarged view of a region PA of the display apparatus of FIG. 8.

FIG. 8 illustrates a schematic plan view of a display apparatus 200 according to another exemplary embodiment, and FIG. 9 illustrates an enlarged view of a region PA of FIG. 8. Referring to FIGS. 8 and 9, the display apparatus 200 may include a substrate 201 and at least one wire, for example, first wires SL1 through SL3, second wires V1 through V3, and third wires D1 through D3.

The display area DA and the non-display area NDA may be defined on the substrate 201. The at least one pixel PU and a penetrating portion 210 may be formed in the display area DA.

The substrate 201 may be formed of any one of various materials. The substrate 201 may be formed of glass, a metal, or an organic material.

According to an exemplary embodiment, the substrate 201 may be formed of a flexible material. For example, the substrate 201 may be formed of a material that is bendable, twistable, foldable, or rollable. The flexible material forming the substrate 201 may be ultra-thin glass, a metal, or plastic. If the substrate 201 is formed of plastic, the substrate 201 may contain PI.

The substrate 201 may be divided into the display area DA and the non-display area NDA. Since locations of the display area DA and the non-display area NDA have been described above, details thereof are not provided again.

The at least one pixel PU and the penetrating portion 210 may be formed in the display area DA.

The separation area BA may be formed between two adjacent pixels PU. The penetrating portion 210 may be formed in the separation area BA. According to an exemplary embodiment, the penetrating portion 210 may be spaced apart from the pixel PU.

The pixel PU may include at least one display device (not shown) realizing visible light as described above, and a structure described with reference to FIGS. 6 and 8 may be applied to the pixel PU of FIG. 8.

The penetrating portion 210 may be formed in the substrate 201. The penetrating portion 210 may include a first penetrating portion 211 and a second penetrating portion 212. The separation area BA may include the first separation area BA1 and the second separation area BA2. The first penetrating portion 211 may be formed in the first separation area BA1 and the second penetrating portion 212 may be formed in the second separation area BA2.

Since descriptions about the penetrating portion 210 and the separation area BA are same as those described above, details thereof are not provided again.

In an embodiment, the at least one wire is electrically connected to the pixel PU, and does not overlap but is spaced apart from the penetrating portion 210.

The at least one wire may include at least one first wire, i.e., the first wires SL1 through SL3.

The first wires SL1 through SL3 may be electrically connected to the pixel PU.

According to an exemplary embodiment, the first wire SL1 may be electrically connected to each of the plurality of pixels PU arranged in a line in a first direction (X-axis direction of FIG. 9).

The first wire SL1 may be formed to have at least one bent area. The first wire SL1 may have an area extending in the first direction, and an area bent in a second direction (Y-axis direction of FIG. 9) crossing the first direction around the first penetrating portion 211, wherein the area bent in the second direction may be an area protruding in the second direction. Accordingly, the first wire SL1 may be spaced apart from the first and second penetrating portions 211 and 212.

According to an exemplary embodiment, the first wire SL2 may be disposed below the first wire SL1, i.e., adjacent to the first wire SL1 in the second direction crossing the first direction, and may be electrically connected to the plurality of pixels PU arranged in the line in the first direction.

The first wire SL2 may be formed to have at least one bent area. The first wire SL2 may have an area extending in the first direction, and an area bent in the second direction around the first penetrating portion 211, wherein the area bent in the second direction may be an area protruding in the second direction. Accordingly, the first wire SL2 may be spaced apart from the first and second penetrating portions 211 and 212.

According to an exemplary embodiment, the first wire SL2 may be symmetrical to the first wire SL1, and the first wire SL2 may be symmetrical to the first wire SL1 about the second penetrating portion 212.

The first wire SL3 may have the same shape as the first wire SL1. The first wire SL3 may be electrically connected to each of the plurality of pixels PU arranged in the line in the first direction.

The first wire SL3 may be formed to have at least one bent area. The first wire SL3 may have an area extending in the first direction, and an area bent in the second direction crossing the first direction around the first penetrating portion 211, wherein the area bent in the second direction may be an area protruding in the second direction. Accordingly, the first wire SL3 may be spaced apart from the first and second penetrating portions 211 and 212.

Although not illustrated, a first wire (not shown) having the same shape as the first wire SL2 may be formed below the first wire SL3. An arrangement of the first wires SL1 through SL3 may be repeated.

The first wires SL1 through SL3 may transmit various signals to the pixel PU. According to an exemplary embodiment, the first wires SL1 through SL3 may transmit a scan signal to the pixel PU. In an embodiment, the first wires SL1 through SL3 may be electrically connected to the gate electrode 105 of the TFT of FIG. 7.

The at least one wire may include at least one second wire, i.e., the second wires V1 through V3.

The second wires V1 through V3 may be electrically connected to the pixel PU.

According to an exemplary embodiment, the second wire V1 may be electrically connected to the plurality of pixels PU arranged in a line in the second direction.

The second wire V1 may be formed to have at least one bent area. The second wire V1 may have an area extending in the second direction, and an area bent in the first direction around the second penetrating portion 212, wherein the area bent in the first direction may be an area protruding in the first direction. Accordingly, the second wire V1 may be spaced apart from the first and second penetrating portions 211 and 212.

According to an exemplary embodiment, the second wire V2 may be disposed in a side direction (for example, right side) of the second wire V1, i.e., adjacent to the second wire V1 in the first direction crossing the second direction, and may be electrically connected to each of the plurality of pixels PU arranged in the line in the second direction.

The second wire V2 may be formed to have at least one bent area. The second wire V2 may have an area extending in the second direction, and an area bent in the first direction around the second penetrating portion 212, wherein the area bent in the first direction may be an area protruding in the first direction. Accordingly, the second wire V2 may be spaced apart from the first and second penetrating portions 211 and 212.

According to an exemplary embodiment, the second wire V2 may be symmetrical to the second wire V1, for example, the second wire V2 may be symmetrical to the second wire V1 about the first penetrating portion 211.

The second wire V3 may have the same shape as the second wire V1. The second wire V3 may be electrically connected to each of the plurality of pixels PU arranged in the line in the second direction.

The second wire V3 may be formed to have at least one bent area. The second wire V3 may have an area extending in the second direction, and an area bent in the first direction around the second penetrating portion 212, wherein the area bent in the first direction may be an area protruding in the first direction. Accordingly, the second wire V3 may be spaced apart from the first and second penetrating portions 211 and 212.

Although not illustrated, a second wire (not shown) having the same shape as the second wire V2 may be formed at the right side of the second wire V3. An arrangement of the second wires V1 through V3 may be repeated.

The second wires V1 through V3 may transmit various signals to the pixel PU. According to an exemplary embodiment, the second wires V1 through V3 may transmit a power supply signal to the pixel PU. According to an exemplary embodiment, the second wires V1 through V3 may be electrically connected to the first or second electrode 131 or 132 of FIG. 6 or 7.

The at least one wire may include at least one third wire, i.e., the third wires D1 through D3.

The third wires D1 through D3 may be electrically connected to the pixel PU.

According to an exemplary embodiment, the third wire D1 may be electrically connected to the plurality of pixels PU arranged in the line in the second direction.

The third wire D1 may be formed to have at least one bent area. The third wire D1 may have an area extending in the second direction, and an area bent in the first direction around the second penetrating portion 212, wherein the area bent in the first direction may be an area protruding in the first direction. Accordingly, the third wire D1 may be spaced apart from the first and second penetrating portions 211 and 212.

According to an exemplary embodiment, the third wire D1 may be spaced apart from the second wires V1 through V3. The second penetrating portion 212 corresponding to the area of the third wire D1 bent in the first direction and the second penetrating portion 212 corresponding to the areas of the second wires V1 through V3 bent in the first direction may be different from each other, and for example, may be adjacent to each other.

According to an exemplary embodiment, the third wire D2 may be disposed in a side direction (for example, a right side) of the third wire D1, i.e., may be adjacent to the third wire D1 in the first direction crossing the second direction, and may be electrically connected to each of the plurality of pixels PU arranged in the line in the second direction.

The third wire D2 may be formed to have at least one bent area. The third wire D2 may have an area extending in the second direction, and an area bent in the first direction around the second penetrating portion 212, wherein the area bent in the first direction may be an area protruding in the first direction. Accordingly, the third wire D2 may be spaced apart from the first and second penetrating portions 211 and 212.

According to an exemplary embodiment, the third wire D2 may be symmetrical to the third wire D1, for example, the third wire D2 may be symmetrical to the third wire D1 about the first penetrating portion 211.

According to an exemplary embodiment, the third wire D2 may be spaced apart from the second wires V1 through V3. The second penetrating portion 212 corresponding to the area of the third wire D2 bent in the first direction and the second penetrating portion 212 corresponding to the areas of the second wires V1 through V3 bent in the first direction may be different from each other, and for example, may be adjacent to each other.

The third wire D3 may have the same shape as the third wire D1. The third wire D3 may be electrically connected to each of the plurality of pixels PU arranged in the line in the second direction.

The third wire D3 may be formed to have at least one bent area. The third wire D3 may have an area extending in the second direction, and an area bent in the first direction around the second penetrating portion 212, wherein the area bent in the first direction may be an area protruding in the first direction. Accordingly, the third wire D3 may be spaced apart from the first and second penetrating portions 211 and 212.

According to an exemplary embodiment, the third wire D3 may be spaced apart from the second wires V1 through V3. The second penetrating portion 212 corresponding to the area of the third wire D3 bent in the first direction and the second penetrating portion 212 corresponding to the areas of the second wires V1 through V3 bent in the first direction may be different from each other, and for example, may be adjacent to each other.

Although not illustrated, a third wire (not shown) having the same shape as the third wire D2 may be formed at a right side of the third wire D3. An arrangement of the third wires D1 through D3 may be repeated.

The third wires D1 through D3 may transmit various signals to the pixel PU, and according to an exemplary embodiment, the third wires D1 through D3 may transmit a data signal to the pixel PU. According to an exemplary embodiment, the third wires D1 through D3 may be electrically connected to the source or drain electrode 107 or 108 of FIG. 7.

Although not illustrated, one of the first penetrating portions 111 of FIGS. 3 through 5 may be applied to the display apparatus 200 according to the current embodiment.

In the display apparatus 200 according to the current embodiment, the penetrating portion 210 may be formed in the substrate 201, and the flexibility of the substrate 201 may be increased and the weight of the substrate 201 may be decreased.

If the display apparatus 200 is used as a bending display apparatus, a flexible display apparatus, or a stretchable display apparatus, the flexibility of the display apparatus 200 may be increased and abnormal transformation of the display apparatus 200 may be reduced.

According to an exemplary embodiment, since the penetrating portion 210 may include the first penetrating portion 211 extending in one direction and the second penetrating portion 212 extending in a direction crossing the one direction, the flexibility of the substrate 201 may be obtained even when the substrate 201 is bent, curved, or rolled in any direction, abnormal transformation of the substrate 201 may be prevented, and durability of the substrate 201 may be improved. Accordingly, convenience of a user may be improved when the display apparatus 200 is used, for example, the display apparatus 200 may be applied to a wearable apparatus.

According to an exemplary embodiment, the first penetrating portion 211 of the penetrating portion 210 may be formed in an elongated shape to correspond to two pixels PU adjacent in one direction and other two pixels PU respectively adjacent to the two pixels PU, a transformation characteristic may be prevented from being changed at a boundary between the pixels PU to improve durability of the display apparatus 200. Thus, to substrate 201 may be applied to the display apparatus 200 that may require flexibility, such as a bending display apparatus, a flexible display apparatus, or a stretchable display apparatus.

According to an exemplary embodiment, the second penetrating portion 212 of the penetrating portion 210 may be formed in a direction crossing a direction in which the first penetrating portion 211 is formed and in an elongated shape to correspond to two pixels PU and other two pixels PU respectively adjacent to the two pixels PU, and a transformation characteristic may be prevented from being changed at a boundary between the pixels PU to improve the durability of the display apparatus 200. Thus, the substrate 201 may be applied to the display apparatus 200 that may require flexibility, such as a bending display apparatus, a flexible display apparatus, or a stretchable display apparatus.

The display apparatus 200 according to the current embodiment may include the at least one wire, i.e., the first wires SL1 through SL3, the second wires V1 through V3, and the third wires D1 through D3, which may be electrically connected to the pixels PU, wherein the first wires SL1 through SL3, the second wires V1 through V3, and the third wires D1 through D3 do not overlap but are spaced apart from the penetrating portion 210. Accordingly, the penetrating portion 210 may improve the flexibility and durability of the substrate 201. The first wires SL1 through SL3, the second wires V1 through V3, and the third wires D1 through D3 may be prevented from being detached from the penetrating portion 210 since they do not overlap the penetrating portion 210, and may be prevented from being contaminated by a gas, such as external oxygen, or degenerated by moisture.

The first wires SL1 through SL3 from among the at least one wire may extend in one direction, may have a bent area, and may be periodically repeated, and unevenness of the pixels PU caused by the first wires SL1 and SL3 may be reduced or prevented.

The second wires V1 through V3 may extend in one direction, may have a bent area, and may be periodically repeated, and unevenness of the pixels PU caused by the second wires V1 through V3 may be reduced or prevented.

The third wires D1 through D3 may extend in one direction, may have a bent area, and may be periodically repeated, and unevenness of the pixels PU caused by the second wires D1 through D3 may be reduced or prevented.

The second wires V1 through V3 and the third wires D1 through D3, which may extend in the same direction and may be electrically connected to the pixels PU arranged in the same direction, may be formed not to overlap each other, and interference therebetween may be reduced. By forming the bent areas of the second wires V1 through V3 and the third wires D1 through D3 to correspond to different second penetrating portions 212, reduction of an electric characteristic of the pixel PU caused by interference at the bent areas of the second wires V1 through V3 and the third wires D1 through D3 may be prevented.

Figure 10:
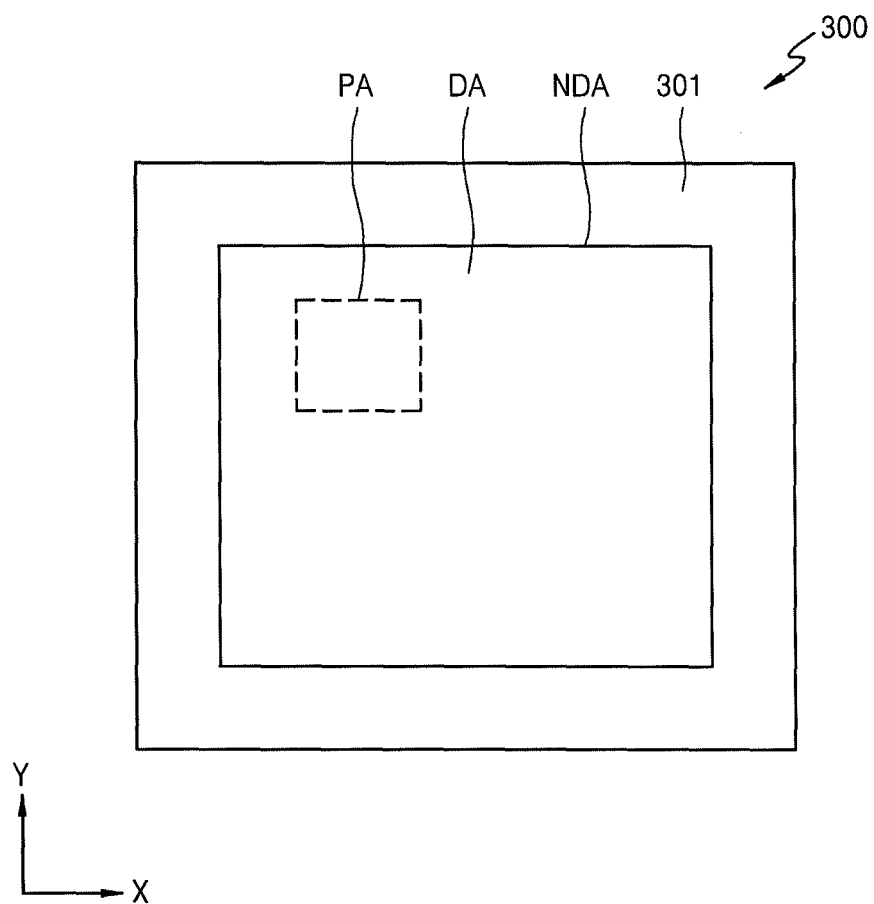
FIG. 10 illustrates a schematic plan view of a display apparatus according to another exemplary embodiment.
Figure 11:
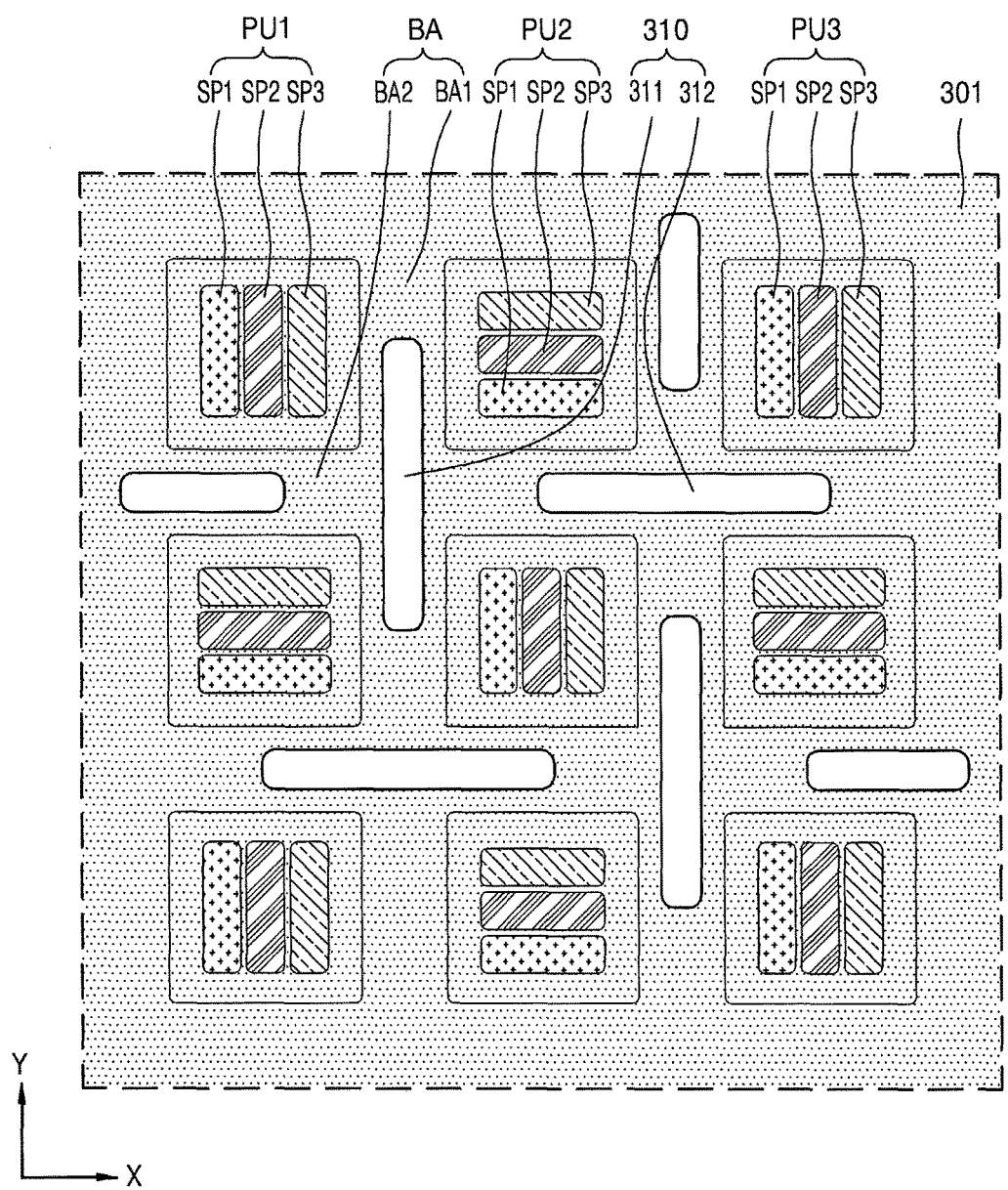
FIG. 11 illustrates an enlarged view of a region PA of the display apparatus of FIG. 10.

FIG. 10 illustrates a schematic plan view of a display apparatus 300 according to another exemplary embodiment, and FIG. 11 illustrates an enlarged view of a region PA of FIG. 10. Referring to FIGS. 10 and 11, the display apparatus 300 may include a substrate 301. The display area DA and the non-display area NDA may be defined on the substrate 301. At least one pixel, for example, pixels PU1 through PU3, and a penetrating portion 310 may be formed in the display area DA.

Each of the pixels PU1 through PU3 may include a plurality of sub-pixels SP1 through SP3.

The substrate 301 may be formed of any one of various materials. The substrate 301 may be formed of glass, a metal, or an organic material.

According to an exemplary embodiment, the substrate 301 may be formed of a flexible material. For example, the substrate 301 may be formed of a material that is bendable, twistable, foldable, or rollable. The flexible material forming the substrate 301 may be ultra-thin glass, a metal, or plastic. If the substrate 301 is formed of plastic, the substrate 301 may contain PI.

The substrate 301 may be divided into the display area DA and the non-display area NDA. At least one pixel PU may be formed in the display area DA to display an image. The sub-pixels SP1 through SP3 may each include a display device (not shown) that may realize visible light. A type of the display device may vary, and a structure described above with reference to FIGS. 6 and 7 may be applied thereto.

The penetrating portion 310 may be formed in the substrate 301. The penetrating portion 310 may be formed to penetrate through the substrate 301. The penetrating portion 310 may include a first penetrating portion 311 and a second penetrating portion 312. The separation area BA may include the first separation area BA1 and the second separation area BA2. The first penetrating portion 311 may be formed in the first separation area BA1 and the second penetrating portion 312 may be formed in the second separation area BA2.

Since descriptions about the penetrating portion 310 and the separation area BA are same as those described above, details thereof are not provided again.

Each of the pixels PU1 through PU3 according to the current embodiment may include at least one sub-pixel.

For example, the pixel PU1 may include a plurality of the sub-pixels SP1 through SP3.

In FIG. 11, three sub-pixels SP1 through SP3 are shown. In an embodiment, the pixel PU1 may include two or at least four sub-pixels.

According to an exemplary embodiment, the plurality of sub-pixels SP1 through SP3 included in the pixel PU1 may realize, for example, emit, visible lights in different colors. For example, the sub-pixels SP1 through SP3 may realize red, green, and blue visible lights.

The sub-pixels SP1 through SP3 included in the pixel PU1 may be arranged in the stated order in one direction, for example, in an X-axis direction of FIG. 11.

The pixel PU2 adjacent to the pixel PU1 may include the plurality of sub-pixels SP1 through SP3, wherein the sub-pixels SP1 through SP3 may be arranged in the stated order in a direction crossing the one direction, for example, in a Y-axis direction of FIG. 11.

The pixel PU3 adjacent to the pixel PU2 may include the plurality of sub-pixels SP1 through SP3, wherein the sub-pixels SP1 through SP3 may be arranged in the stated order in the one direction, for example, in the X-axis direction of FIG. 11.

According to an exemplary embodiment, the pluralities of sub-pixels SP1 through SP3 included in the pixels PU1 through PU3 may be arranged in the one direction (the X-axis direction) or in the direction crossing the one direction (the Y-axis direction).

Although not illustrated, one of the first penetrating portions 111 of FIGS. 3 through 5 may be applied to the display apparatus 300 according to the current embodiment.

In the display apparatus 300 according to the current embodiment, the penetrating portion 310 may be formed in the substrate 301, and the flexibility of the substrate 301 may be increased and the weight of the substrate 301 may be decreased.

The separation area BA may be formed between the pixels PU1 through PU3 from among areas of the substrate 301 such that the substrate 301 may be easily transformed, for example, bent, curved, or rolled, around the pixels PU1 through PU3 and stress generated during the transformation may be reduced or blocked. If the display apparatus 300 is applied as a bending display apparatus, a flexible display apparatus, or a stretchable display apparatus, the display apparatus 300 may have high flexibility and reduced abnormal transformation.

According to an exemplary embodiment, since the penetrating portion 310 may include the first penetrating portion 311 extending in one direction and the second penetrating portion 312 extending in a direction crossing the one direction, the flexibility of the substrate 301 may be obtained even when the substrate 301 is bent, curved, or rolled in any direction, abnormal transformation of the substrate 301 may be prevented, and durability of the substrate 301 may be improved. Accordingly, convenience of a user may be improved when the display apparatus 300 is used, for example, the display apparatus 300 may be applied to a wearable apparatus.

According to an exemplary embodiment, the second penetrating portion 312 may be disposed between two adjacent first penetrating portions 311 from among the plurality of first penetrating portions 311, and a crack may be prevented from being generated in a length direction of the first penetrating portion 311 of the substrate 301 by extending the first penetrating portion 311 in one direction.

The first penetrating portion 311 may be disposed between two adjacent second penetrating portions 312 from among the plurality of second penetrating portions 312, and a crack may be prevented from being generated in a length direction of the second penetrating portion 312 of the substrate 301 by extending the second penetrating portion 312 in one direction.

The pixels PU1 through PU3 may each include the plurality of sub-pixels SP1 through SP3 that are arranged in one direction, wherein a direction the sub-pixels SP1 through SP3 of the pixel PU1 are arranged and a direction the sub-pixels SP1 through SP3 adjacent to the sub-pixels SP1 through SP3 of the pixel PU1 cross each other. Accordingly, the sub-pixels SP1 through SP3 may be arranged to correspond to arrangement directions of the first and second penetrating portions 311 and 312, and even if the arrangement directions of the first and second penetrating portions 311 and 312 are different from each other, visual unevenness with respect to the pixels PU1 through PU3 may be reduced, and an image quality characteristic of the display apparatus 300 may be improved.

Figure 12:
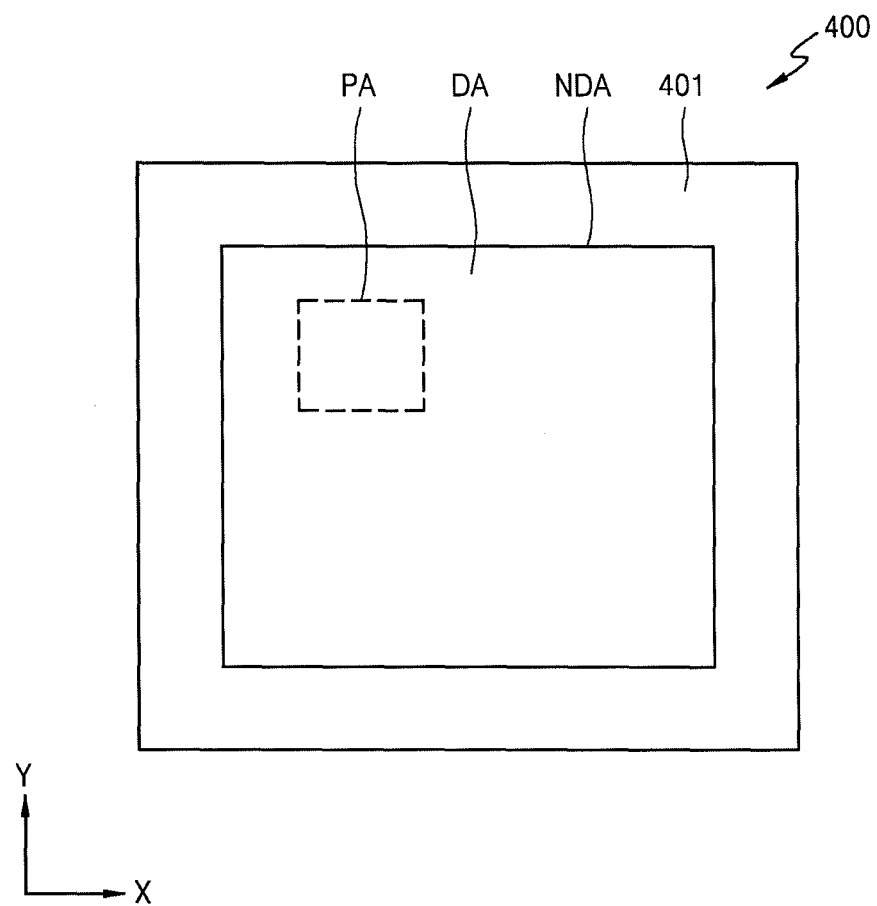
FIG. 12 illustrates a schematic plan view of a display apparatus according to another exemplary embodiment.
Figure 13:
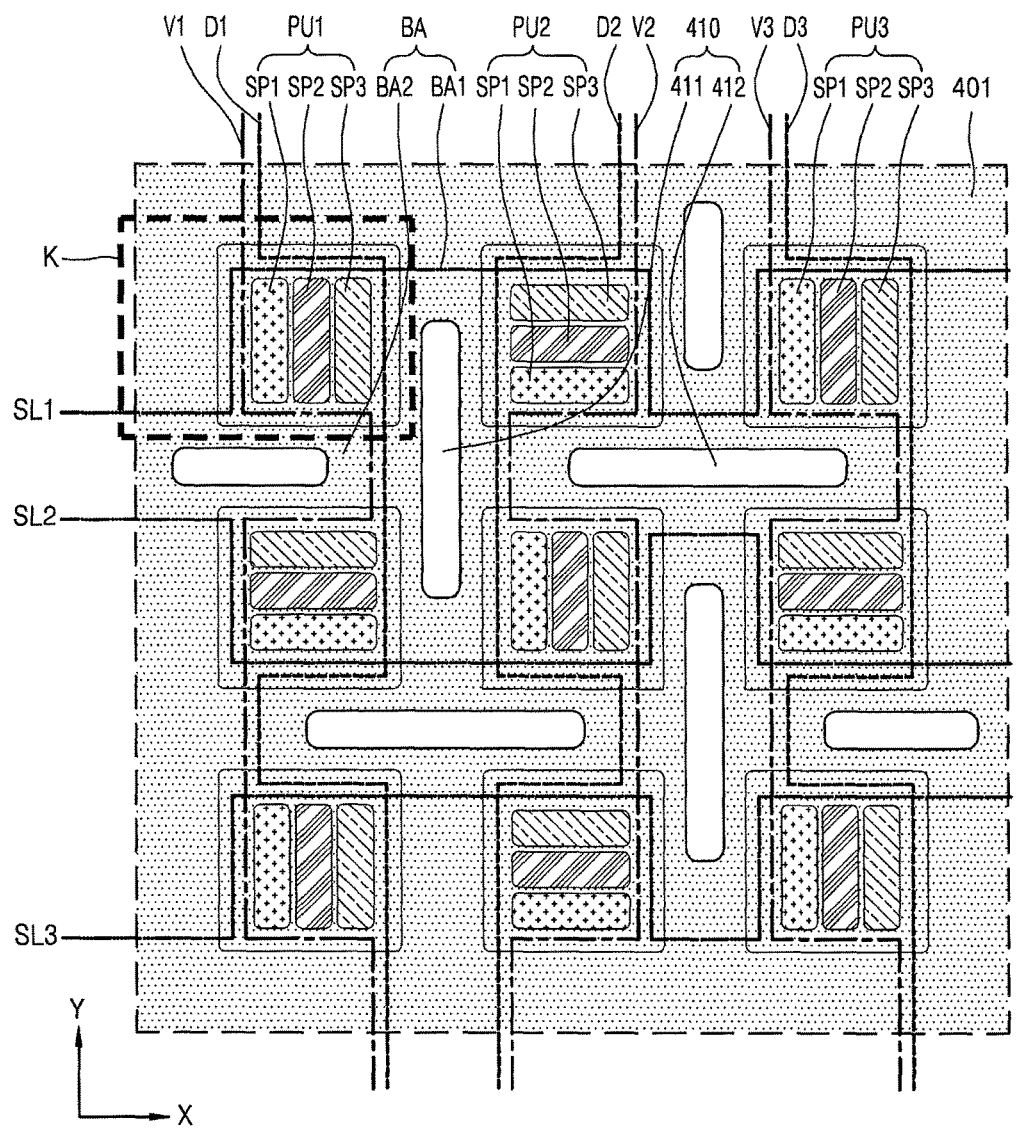
FIG. 13 illustrates an enlarged view of a region PA of the display apparatus of FIG. 12.
Figure 14:
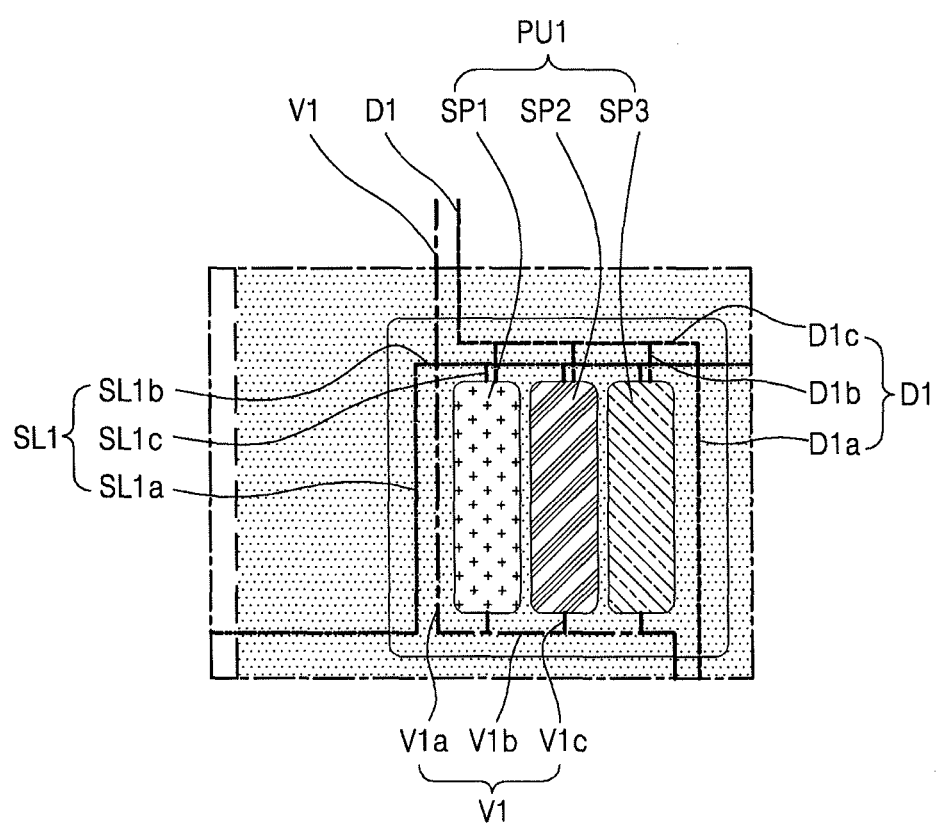
FIG. 14 illustrates an enlarged view of a region K of the display apparatus region PA of FIG. 13.

FIG. 12 illustrates a schematic plan view of a display apparatus 400 according to another exemplary embodiment, FIG. 13 illustrates an enlarged view of a region PA of FIG. 12, and FIG. 14 illustrates an enlarged view of a region K of FIG. 13. Referring to FIGS. 12 through 14, the display apparatus 400 may include a substrate 401 and at least one wire, for example, the first wires SL1 through SL3, the second wires V1 through V3, and the third wires D1 through D3.

The display area DA and the non-display area NDA may be defined on the substrate 401. At least one pixel, for example, the pixels PU1 through P3, and a penetrating portion 410 may be formed in the display area DA.

Each of the pixels PU1 through PU3 may include the plurality of sub-pixels SP1 through SP3.

The substrate 401 may be formed of any one of various materials. The substrate 401 may be formed of glass, a metal, or an organic material.

According to an exemplary embodiment, the substrate 401 may be formed of a flexible material. For example, the substrate 401 may be formed of a material that is bendable, twistable, foldable, or rollable. The flexible material forming the substrate 401 may be ultra-thin glass, a metal, or plastic. If the substrate 401 is formed of plastic, the substrate 401 may contain PI.

The substrate 401 may be divided into the display area DA and the non-display area NDA. The at least one pixel PU may be formed in the display area DA to display an image. Each of the sub-pixels SP1 through SP3 may include a display device (not shown) that may realize visible light. A type of the display device may vary, and the structure described above with reference to FIGS. 6 and 7 may be applied thereto.

The penetrating portion 410 may be formed in the substrate 401. The penetrating portion 410 may be formed to penetrate through the substrate 401. The penetrating portion 410 may include a first penetrating portion 411 and a second penetrating portion 412. The separation area BA may include the first separation area BA1 and the second separation area BA2. The first penetrating portion 411 may be formed in the first separation area BA1 and the second penetrating portion 412 may be formed in the second separation area BA2.

Since descriptions about the penetrating portion 410 and the separation area BA are same as those described above, details thereof are not provided again.

Each of the pixels PU1 through PU3 according to the current embodiment may include at least one sub-pixel.

For example, the pixel PU1 may include the sub-pixels SP1 through SP3.

In FIG. 13, three sub-pixels SP1 through SP3 are shown. In an embodiment, the pixel PU1 may include two ore at least four sub-pixels.

According to an exemplary embodiment, the plurality of sub-pixels SP1 through SP3 included in the pixel PU1 may realize, for example, emit, visible lights in different colors. For example, the sub-pixels SP1 through SP3 may realize red, green, and blue visible lights.

The sub-pixels SP1 through SP3 included in the pixel PU1 may be arranged in the stated order in one direction, for example, in an X-axis direction of FIG. 13.

The pixel PU2 adjacent to the pixel PU1 may include the plurality of sub-pixels SP1 through SP3, wherein the sub-pixels SP1 through SP3 may be arranged in the stated order in a direction crossing the one direction, for example, in a Y-axis direction of FIG. 13.

The pixel PU3 adjacent to the pixel PU2 may include the plurality of sub-pixels SP1 through SP3, wherein the sub-pixels SP1 through SP3 may be arranged in the stated order in the one direction, for example, in the X-axis direction of FIG. 13.

According to an exemplary embodiment, the pluralities of sub-pixels SP1 through SP3 included in the pixels PU1 through PU3 may be arranged in the one direction (the X-axis direction) or in the direction crossing the one direction (the Y-axis direction).

Although not illustrated, one of the first penetrating portions 111 of FIGS. 3 through 5 may be applied to the display apparatus 400 according to the current embodiment.

The at least one wire may include the first wires SL1 through SL3.

The first wires SL1 through SL3 may be electrically connected to the pixels PU1 through PU3.

According to an exemplary embodiment, the first wire SL1 may be electrically connected to each of the plurality of pixels PU1 through PU3 arranged in a line in a first direction (X-axis direction of FIG. 13).

The first wire SL1 may be formed to have at least one bent area. The first wire SL1 may have an area extending in the first direction, and an area bent in a second direction (Y-axis direction of FIG. 13) crossing the first direction around the first penetrating portion 411, wherein the area bent in the second direction may be an area protruding in the second direction. Accordingly, the first wire SL1 may be spaced apart from the first and second penetrating portions 411 and 412.

According to an exemplary embodiment, the first wire SL2 may be disposed below the first wire SL1, i.e., adjacent to the first wire SL1 in the second direction crossing the first direction, and may be electrically connected to the plurality of pixels PU arranged in the line in the first direction.

The first wire SL2 may be formed to have at least one bent area. The first wire SL2 may have an area extending in the first direction, and an area bent in the second direction around the first penetrating portion 411, wherein the area bent in the second direction may be an area protruding in the second direction. Accordingly, the first wire SL2 may be spaced apart from the first and second penetrating portions 411 and 412.

According to an exemplary embodiment, the first wire SL2 may be symmetrical to the first wire SL1, for example, the first wire S12 may be symmetrical to the first wire SL1 about the second penetrating portion 412.

The first wire SL3 may have the same shape as the first wire SL1. The first wire SL3 may be electrically connected to each of the plurality of pixels PU1 through PU3 arranged in the line in the first direction.

The first wire SL3 may be formed to have at least one bent area. The first wire SL3 may have an area extending in the first direction, and an area bent in the second direction crossing the first direction around the first penetrating portion 411, wherein the area bent in the second direction may be an area protruding in the second direction. Accordingly, the first wire SL3 may be spaced apart from the first and second penetrating portions 411 and 412.

Although not illustrated, a first wire (not shown) having the same shape as the first wire SL2 may be formed below the first wire SL3. An arrangement of the first wires SL1 through SL3 may be repeated.

The first wires SL1 through SL3 may transmit various signals to the pixels PU1 through PU3. According to an exemplary embodiment, the first wires SL1 through SL3 may transmit a scan signal to the pixels PU1 through PU3. In an embodiment, the first wires SL1 through SL3 may be electrically connected to the gate electrode 105 of the TFT of FIG. 7.

The at least one wire may include at least one second wire, i.e., the second wires V1 through V3.

The second wires V1 through V3 may be electrically connected to the pixels PU1 through PU3.

According to an exemplary embodiment, the second wire V1 may be electrically connected to the pixels PU1 through PU3 arranged in a line in the second direction.

The second wire V1 may be formed to have at least one bent area. The second wire V1 may have an area extending in the second direction, and an area bent in the first direction around the second penetrating portion 412, wherein the area bent in the first direction may be an area protruding in the first direction. Accordingly, the second wire V1 may be spaced apart from the first and second penetrating portions 411 and 412.

According to an exemplary embodiment, the second wire V2 may be disposed in a side direction (for example, right side) of the second wire V1, i.e., adjacent to the second wire V1 in the first direction crossing the second direction, and may be electrically connected to each of the pixels PU1 through PU3 arranged in the line in the second direction.

The second wire V2 may be formed to have at least one bent area. The second wire V2 may have an area extending in the second direction, and an area bent in the first direction around the second penetrating portion 412, wherein the area bent in the first direction may be an area protruding in the first direction. Accordingly, the second wire V2 may be spaced apart from the first and second penetrating portions 411 and 412.

According to an exemplary embodiment, the second wire V2 may be symmetrical to the second wire V1, for example, the second wire V2 may be symmetrical to the second wire V1 about the first penetrating portion 411.

The second wire V3 may have the same shape as the second wire V1. The second wire V3 may be electrically connected to each of the pixels PU1 through P3 arranged in the line in the second direction.

The second wire V3 may be formed to have at least one bent area. The second wire V3 may have an area extending in the second direction, and an area bent in the first direction around the second penetrating portion 412, wherein the area bent in the first direction may be an area protruding in the first direction. Accordingly, the second wire V3 may be spaced apart from the first and second penetrating portions 411 and 412.

Although not illustrated, a second wire (not shown) having the same shape as the second wire V2 may be formed at the right side of the second wire V3. An arrangement of the second wires V1 through V3 may be repeated.

The second wires V1 through V3 may transmit various signals to the pixels PU1 through PU3. According to an exemplary embodiment, the second wires V1 through V3 may transmit a power supply signal to the pixels PU1 through PU3. According to an exemplary embodiment, the second wires V1 through V3 may be electrically connected to the first or second electrode 131 or 132 of FIG. 6 or 7.

The at least one wire may include at least one third wire, i.e., the third wires D1 through D3.

The third wires D1 through D3 may be electrically connected to the pixels PU1 through PU3.

According to an exemplary embodiment, the third wire D1 may be electrically connected to the pixels PU1 through PU3 arranged in the line in the second direction.

The third wire D1 may be formed to have at least one bent area. The third wire D1 may have an area extending in the second direction, and an area bent in the first direction around the second penetrating portion 412, wherein the area bent in the first direction may be an area protruding in the first direction. Accordingly, the third wire D1 may be spaced apart from the first and second penetrating portions 411 and 412.

According to an exemplary embodiment, the third wire D1 may be spaced apart from the second wires V1 through V3. The second penetrating portion 412 corresponding to the area of the third wire D1 bent in the first direction and the second penetrating portion 412 corresponding to the areas of the second wires V1 through V3 bent in the first direction may be different from each other, and for example, may be adjacent to each other.

According to an exemplary embodiment, the third wire D2 may be disposed in a side direction (for example, a right side) of the third wire D1, i.e., may be adjacent to the third wire D1 in the first direction crossing the second direction, and may be electrically connected to each of the pixels PU1 through PU3 arranged in the line in the second direction.

The third wire D2 may be formed to have at least one bent area. The third wire D2 may have an area extending in the second direction, and an area bent in the first direction around the second penetrating portion 412, wherein the area bent in the first direction may be an area protruding in the first direction. Accordingly, the third wire D2 may be spaced apart from the first and second penetrating portions 411 and 412.

According to an exemplary embodiment, the third wire D2 may be symmetrical to the third wire D1, for example, the third wire D2 may be symmetrical to the third wire D1 about the first penetrating portion 411.

According to an exemplary embodiment, the third wire D2 may be spaced apart from the second wires V1 through V3. The second penetrating portion 412 corresponding to the area of the third wire D2 bent in the first direction and the second penetrating portion 412 corresponding to the areas of the second wires V1 through V3 bent in the first direction may be different from each other, and for example, may be adjacent to each other.

The third wire D3 may have the same shape as the third wire D1. The third wire D3 may be electrically connected to each of the pixels PU1 through PU3 arranged in the line in the second direction.

The third wire D3 may be formed to have at least one bent area. The third wire D3 may have an area extending in the second direction, and an area bent in the first direction around the second penetrating portion 412, wherein the area bent in the first direction may be an area protruding in the first direction. Accordingly, the third wire D3 may be spaced apart from the first and second penetrating portions 411 and 412.

According to an exemplary embodiment, the third wire D3 may be spaced apart from the second wires V1 through V3. The second penetrating portion 412 corresponding to the area of the third wire D3 bent in the first direction and the second penetrating portion 412 corresponding to the areas of the second wires V1 through V3 bent in the first direction may be different from each other, and for example, may be adjacent to each other.

Although not illustrated, a third wire (not shown) having the same shape as the third wire D2 may be formed at a right side of the third wire D3. An arrangement of the third wires D1 through D3 may be repeated.

The third wires D1 through D3 may transmit various signals to the pixels PU1 through PU3, and according to an exemplary embodiment, the third wires D1 through D3 may transmit a data signal to the pixels PU1 through PU3. According to an exemplary embodiment, the third wires D1 through D3 may be electrically connected to the source or drain electrode 107 or 108 of FIG. 7.

Each of the at least one wire, i.e., the first wires SL1 through SL3, the second wires V1 through V3, and the third wires D1 through D3, may be electrically connected to the pixels PU1 through PU3. Although not shown in FIG. 13, each of the at least one wire may be electrically connected to each of the sub-pixels SP1 through SP3 of each of the pixels PU1 through PU3.

Each of the at least one wire being electrically connected to each of the sub-pixels SP1 through SP3 will now be described with reference to FIG. 14. FIG. 14 illustrates an enlarged view of a region K of FIG. 13.

Referring to FIG. 14, the first wire SL1 may be electrically connected to the sub-pixels SP1 through SP3 of the pixel PU1. The first wire SL1 may have any shape. According to an exemplary embodiment, the first wire SL1 may include a plurality of connecting wires SL1c that are spaced apart from each other and are connected to each of the sub-pixels SP1 through SP3, a common wire SL1b that may be commonly connected to the plurality of connecting wires SL1c, and a body wire SL1a that may be connected to the common wire SL1b and formed to correspond to a side surface of one of the sub-pixels SP1 may be SP3, for example, the sub-pixel SP1.

The second wire V1 is electrically connected to the sub-pixels SP1 through SP3 of the pixel PU1. The second wire V1 may have any shape. According to an exemplary embodiment, the second wire V1 may include a plurality of connecting wires V1c that are spaced apart from each other and are connected to each of the sub-pixels SP1 through SP3, a common wire V1b that may be commonly connected to the plurality of connecting wires V1c, and a body wire V1a that may be connected to the common wire V1b and formed to correspond to a side surface of one of the sub-pixels SP1 through SP3, for example, the sub-pixel SP1.

The third wire D1 may be electrically connected to the sub-pixels SP1 through SP3 of the pixel PU1. The third wire D1 may have any shape. According to an exemplary embodiment, the second wire D1 may include a plurality of connecting wires D1c that are spaced apart from each other and are connected to each of the sub-pixels SP1 through SP3, a common wire D1b that may be commonly connected to the plurality of connecting wires D1c, and a body wire D1a that may be connected to the common wire D1b and formed to correspond to a side surface of one of the sub-pixels SP1 through SP3, for example, the sub-pixel SP1.

In the display apparatus 400 according to the current embodiment, the penetrating portion 410 may be formed in the substrate 401, and flexibility of the substrate 401 may be increased and the weight of the substrate 401 may be decreased.

The separation area BA may be formed between the pixels PU1 through PU3 from among areas of the substrate 401 such that the substrate 401 may be easily transformed, for example, bent, curved, or rolled, around the pixels PU1 through PU3 and stress generated during the transformation may be reduced or blocked. If the display apparatus 400 is applied as a bending display apparatus, a flexible display apparatus, or a stretchable display apparatus, the display apparatus 400 may have high flexibility and reduced abnormal transformation.

According to an exemplary embodiment, since the penetrating portion 410 may include the first penetrating portion 411 extending in one direction and the second penetrating portion 412 extending in a direction crossing the one direction, the flexibility of the substrate 401 may be obtained even when the substrate 401 is bent, curved, or rolled in any direction, abnormal transformation of the substrate 401 may be prevented, and durability of the substrate 401 may be improved. Accordingly, convenience of a user may be improved when the display apparatus 400 is used, for example, the display apparatus 400 may be applied to a wearable apparatus.

According to an exemplary embodiment, the second penetrating portion 412 may be disposed between two adjacent first penetrating portions 411 from among the plurality of first penetrating portions 411, and a crack may be prevented from being generated in a length direction of the first penetrating portion 411 of the substrate 401 by extending the first penetrating portion 411 in one direction.

The first penetrating portion 411 may be disposed between two adjacent second penetrating portions 412 from among the plurality of second penetrating portions 412, and a crack may be prevented from being generated in a length direction of the second penetrating portion 412 of the substrate 401 by extending the second penetrating portion 412 in one direction.

The pixels PU1 through PU3 may each include the plurality of sub-pixels SP1 through SP3 that are arranged in one direction, wherein a direction the sub-pixels SP1 through SP3 of the pixel PU1 are arranged and a direction the sub-pixels SP1 through SP3 adjacent to the sub-pixels SP1 through SP3 of the pixel PU1 cross each other. Accordingly, the sub-pixels SP1 through SP3 may be arranged to correspond to arrangement directions of the first and second penetrating portions 411 and 412, and even if the arrangement directions of the first and second penetrating portions 411 and 412 are different from each other, visual unevenness with respect to the pixels PU1 through PU3 may be reduced, and an image quality characteristic of the display apparatus 400 may be improved.

The display apparatus 400 according to the current embodiment may include the at least one wire, i.e., the first wires SL1 through SL3, the second wires V1 through V3, and the third wires D1 through D3, wherein the first wires SL1 through SL3, the second wires V1 through V3, and the third wires D1 through D3 do not overlap but are spaced apart from the penetrating portion 410. Accordingly, the penetrating portion 410 may improve the flexibility and durability of the substrate 401 0. The first wires SL1 through SL3, the second wires V1 through V3, and the third wires D1 through D3 may be prevented from being detached from the penetrating portion 410 since they do not overlap the penetrating portion 410, and may be prevented from being contaminated by a gas, such as external oxygen, or degenerated by moisture.

The first wires SL1 through SL3 from among the at least one wire may extend in one direction, may have a bent area, and may be periodically repeated, and unevenness of the display device 400 caused by the first wires SL1 and SL3 may be reduced or prevented. The second wires V1 through V3 and the third wires D1 through D3 may reduce or prevent the unevenness.

The second wires V1 through V3 and the third wires D1 through D3, which may extend in the same direction may be formed not to overlap each other, and interference therebetween may be reduced. By forming the bent areas of the second wires V1 through V3 and the third wires D1 through D3 to correspond to different second penetrating portions 412, reduction of an electric characteristic of the display apparatus 400 caused by interference at the bent areas of the second wires V1 through V3 and the third wires D1 through D3 may be prevented.

Each of the pixels PU1 through PU3 may include the sub-pixels SP1 through SP3 arranged in a certain direction, and each of the at least one wire may be connected to the sub-pixels SP1 through SP3 and may be curved to be spaced apart from the penetrating portion 410, and the at least one wire may include a plurality of connecting wires, a common wire, and a body wire connected to the sub-pixels SP1 through SP3. Accordingly, the first wires SL1 through SL3, the second wires V1 through V3, and the third wires D1 through D3 may be electrically connected to the sub-pixels SP1 through SP3 without overlapping the penetrating portion 410.

By way of summation and review, display apparatuses may be replaced by portable flat panel type display apparatuses.

It may be not easy to improve durability of portable flat panel type display apparatuses due to difficulties in manufacturing processes, for example, difficulties in manufacturing the portable flat panel type display apparatuses to have a certain thickness. For example, portable flat panel type display apparatuses may need to be flexible according to an intention of a user or during manufacture, for example, may need to be bent or folded. However, it may not be easy to manufacture durable portable flat panel type display apparatuses while obtaining flexibility.

As described above, according to one or more exemplary embodiments, a display apparatus may improve convenience of a user.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a substrate;
   a plurality of pixels that are on the substrate and include at least one display device;
   a separation area that is on the substrate and between two adjacent pixels from among the plurality of pixels; and
   a penetrating portion that is in the separation area and penetrates the substrate, wherein the penetrating portion includes a first penetrating portion and a second penetrating portion being spaced apart from each other and being adjacent to each other, the first penetrating portion extending in a second direction, the second penetrating portion extending in a first direction crossing the second direction, wherein a short side of the first penetrating portion faces a long side of the second penetrating portion in the second direction, wherein the penetrating portion does not include an overlapping region where the first penetrating portion and the second penetrating portion overlap and contact each other, wherein the plurality of pixels include first and second pixels being adjacent in the first direction and being spaced apart from each other in the first direction, the first pixel including upper and lower corners, the second pixel including an upper corner facing the upper corner of the first pixel and a lower corner facing the lower corner of the first pixel, and wherein:

the upper corner of the first pixel and the upper corner of the second pixel are not continuously connected to each other through the separation area in the first direction by the penetrating portion therebetweeen, and the lower corner of the first pixel and the lower corner of the second pixel are continuously connected to each other through the separation area in the first direction without the penetrating portion therebetween.

2. The display apparatus as claimed in claim 1, further comprising at least one wire electrically connected to the plurality of pixels, wherein the at least one wire does not overlap the penetrating portion.

3. The display apparatus as claimed in claim 2, wherein the at least one wire extends in one direction and includes an area that bends in another direction intersecting the one direction around the penetrating portion.

4. The display apparatus as claimed in claim 2, wherein:
the at least one wire includes a plurality of wires, and
two wires adjacent to each other in one direction from among the plurality of wires are symmetrical about the penetrating portion.

5. The display apparatus as claimed in claim 2, wherein:
the at least one wire includes a plurality of wires and the penetrating portion includes a plurality of penetrating portions,
the plurality of wires include a first wire, a second wire, and a third wire,
the first wire is electrically connected to pixels that are arranged in one direction from among the plurality of pixels,
the second and third wires are each electrically connected to pixels arranged in another direction crossing the one direction from among the plurality of pixels,
the second wire includes an area that bends in the one direction around one of the plurality of penetrating portions, and
the third wire includes an area that bends in the one direction around another one of the plurality of penetrating portions.

6. The display apparatus as claimed in claim 1, wherein:
the separation area includes a first separation area and a second separation area,
the first separation area includes an area between two pixels adjacent in the first direction from among the plurality of pixels, the second separation area includes an area between two pixels adjacent in the second direction intersecting the first direction from among the plurality of pixels, and
the first penetrating portion is in the first separation area and the second penetrating portion is in the second separation area.

7. The display apparatus as claimed in claim 6, wherein the first penetrating portion extends in an elongated shape along the two pixels adjacent in the second direction.

8. The display apparatus as claimed in claim 6, wherein the first penetrating portion extends in an elongated shape such that a region of the first penetrating portion is beyond a boundary of the two pixels adjacent in the first direction in the first separation area in the second direction.

9. The display apparatus as claimed in claim 6, wherein the second penetrating portion extends in an elongated shape along the two pixels adjacent in the first direction.

10. The display apparatus as claimed in claim 6, wherein the second penetrating portion extends in an elongated shape such that a region of the second penetrating portion is beyond a boundary of the two pixels adjacent in the second direction in the second separation area in the first direction.

11. The display apparatus as claimed in claim 6, wherein:
the penetrating portion includes a plurality of first penetrating portions and a plurality of second penetrating portions,
at least one of the plurality of second penetrating portions is between two adjacent first penetrating portions from among the plurality of first penetrating portions, and
at least one of the plurality of first penetrating portions is between two adjacent second penetrating portions from among the plurality of second penetrating portions.

12. The display apparatus as claimed in claim 1, further comprising a first insulating layer on the substrate, wherein the first insulating layer overlaps the penetrating portion.

13. The display apparatus as claimed in claim 1, further comprising a first insulating layer on the substrate, wherein the first insulating layer includes an insulating penetrating portion having an area overlapping the penetrating portion.

14. The display apparatus as claimed in claim 1, wherein:
the plurality of pixels each includes a plurality of sub-pixels,
sub-pixels of at least one pixel of the plurality of pixels are arranged in one direction, and
sub-pixels of a pixel adjacent to the at least one pixel are arranged in another direction crossing the one direction.

15. The display apparatus as claimed in claim 14, further comprising at least one wire electrically connected to each of the plurality of sub-pixels of each of the plurality of pixels, wherein:
the at least one wire does not overlap the penetrating portion, and
the at least one wire includes a plurality of connecting wires each connected to the sub-pixels of the at least one of the plurality of pixels and spaced apart from each other, a common wire commonly connected to the plurality of connecting wires, and a body wire connected to the common wire and corresponding to a side of one of the plurality of sub-pixels.

16. The display apparatus as claimed in claim 1, wherein the substrate includes a flexible material.

17. The display apparatus as claimed in claim 16, wherein the flexible material contains an organic material.

18. The display apparatus as claimed in claim 1, wherein the display apparatus includes a first electrode, a second electrode, and an intermediate layer between the first and second electrodes and including an organic emission layer.

19. The display apparatus as claimed in claim 1, wherein the short side of the first penetrating portion faces only the long side of the second penetrating portion in the second direction.

20. The display apparatus as claimed in claim 1, wherein the first penetrating portion extends along a side of a first pixel such that the short side of the first penetrating portion is adjacent to a center of the side of the first pixel.

* * * * *